United States Patent [19]

Micka et al.

[11] Patent Number: 5,657,440
[45] Date of Patent: Aug. 12, 1997

[54] ASYNCHRONOUS REMOTE DATA COPYING USING SUBSYSTEM TO SUBSYSTEM COMMUNICATION

[75] Inventors: William Frank Micka, Tucson, Ariz.; Robert Wesley Shomler, Morgan Hill, Calif.

[73] Assignee: International Business Machines Corporation, Armonk, N.Y.

[21] Appl. No.: 671,096

[22] Filed: Jun. 28, 1996

Related U.S. Application Data

[63] Continuation of Ser. No. 215,238, Mar. 21, 1994.

[51] Int. Cl.$^6$ ................................................. G06F 11/00
[52] U.S. Cl. ........................... 395/182.14; 395/601
[58] Field of Search ..................... 395/182.14, 182.13, 395/600

[56] References Cited

U.S. PATENT DOCUMENTS

| | | | |
|---|---|---|---|
| 5,133,065 | 7/1992 | Cheffetz et al. | 395/575 |
| 5,155,845 | 10/1992 | Beal et al. | 395/575 |
| 5,375,232 | 12/1994 | Legvold et al. | 395/575 |
| 5,379,398 | 1/1995 | Cohn et al. | 395/575 |

FOREIGN PATENT DOCUMENTS

| | | |
|---|---|---|
| 0455922 | 12/1990 | European Pat. Off. . |
| 9103848 | 5/1991 | WIPO . |

OTHER PUBLICATIONS

Levy & Silberschatz, Log-Driven Backups: A Recovery Scheme for Large Memory Database Systems, 1990 Jerusalem Conference on Information Technology, at 99.

Levy & Silberschatz, Incremental Recovery in Main Memory Database Systems, IEEE Transactions on Knowledge and Data Engineering, Dec. 1992, at 529.

Russinovich & Segall, Application–Transparent Checkpointing in Mach 3.0/UX, Proceedings of the 28th Annual Hawaii Int'l Conf. on System Science, at 114.

Koo & Toueg, Checkpointing and Rollback–Recovery for Distributed Systems, IEEE Transactions on Software Engineering, Jan. 1987, ay 23.

Sens, The Performance of Independent Checkpointing in Distributed Systems, Proceedings of the 28th Annual Hawaii Int'l Conf. on System Science, at 525.

Oracle RDBMS Database Administrator's Guide, vol. 1, Version 7.0, May 1992, pp. 1–14 to 1–49, 2–5 to 2–6; 3–1 to 3–6; 3–12 to 3–14; 27–15 to 27–23; Ch 28.

King et al., Overview of Disaster Recovery for Transaction Processing Systems, 1990 Distributed Computing Systems International Conference, at 286.

Dishon et al., Disk Dual Copy Methods and Their Performance, 1988 Fault Tolerant Computing International Symposium, at 314.

Lomet, Using Timestamping to Optimize Two Phase Commit, 1993 Parallel and Distributed Information Systems International Conference, at 48.

Garcia–Molina et al., Issue in Disaster Recovery, COMPCON Spring '90 IEEE Computer Society International Conference, at 573.

Hobbs, The Distributed Features in Rdb, IEE Colloq. (1992) No. 229: Distributed Databases, at 2/1.

An Efficient Scheme for Providing High Availability, Anupam Bhide, Ambuj Goyal, Hui–I Hsiao, and Anant Jhingran, IBM T.J. Watson Research Center, Feb. 1992, pp. 236–245.

*Primary Examiner*—Robert W. Beausoliel, Jr.
*Assistant Examiner*—Norman M. Wright
*Attorney, Agent, or Firm*—Benman Collins & Sawyer; Bruce Brodie

[57] ABSTRACT

A method and means for asynchronous remote data duplexing at a distant location from copies based at a primary site storage subsystem in which there are first and second pluralities of subsystems at primary and remote sites respectively. Each of the first plurality of subsystems is independently coupled to one or more of the second plurality of subsystems. Further, the first plurality of subsystems is interconnected, and the second plurality of subsystems is interconnected. The method utilizes checkpoint messages to maintain sequence integrity between the first and second plurality of subsystems without the use of a centralized communications service.

16 Claims, 7 Drawing Sheets

ASYNCHRONOUS REMOTE DATA COPYING USING SUBSYSTEM TO SUBSYSTEM COMMUNICATION

This application is a continuation of application Ser. No. 08/215,238 filed on Mar. 21, 1994, now abandoned.

BACKGROUND OF THE INVENTION

1. Field of the Invention

The present invention relates data preservation in an information handling system by asynchronous remote data duplexing (also termed remote data copying) and more particularly, information to the real-time continuous copying of data at a remote location from copies based at a primary site storage subsystem.

2. Description of the Related Art

Data copying is one form of data preservation in an information handling or computer system. However, data preservation via data copying must take many factors into account. This is of special significance where it is anticipated that data copied and stored at a remote site would be the repository for any continued interaction with the data should the work and data of a primary site become unavailable. The factors of interest in copying include the protection domain (system and/or environmental failure or device and/or media failure), data loss (no loss/partial loss), time where copying occurs as related to the occurrence of other data and processes (point in time/real time), the degree of disruption to applications executing on said computer, and whether the copy is application or storage system based. With regard to the last factor, application based copying involves log files, data files, and program routines while storage based copying involves an understanding of direct access storage device (DASD) addresses with no knowledge of data types or application use of the data.

Real-time remote data duplexing systems require some means to ensure update sequence integrity as write updates to the secondary or remote DASD data copy. One way to accomplish this is to provide a synchronous system to control the DASD subsystems. In such a system, the primary DASD write operation does not complete until a copy of that data has been confirmed at a secondary location. The problem with such synchronous systems is that they slow down the overall operation of the duplexing system.

Asynchronous copy systems accomplish sequence integrity through a centralization and consolidation of data communications between primary and secondary DASD subsystems through a central communications system. In such systems, a system at the primary site can determine the sequence among different update write operations among all DASD subsystems at the primary site and communicate that information to the DASD subsystem at the remote site. The secondary subsystem in turn uses the sequence information from the primary to control the application of update data to the secondary DASD data copy. Known asynchronous copy systems that utilize centralized data communications are described below.

McIlvain and Shomler, U.S. patent application Ser. No. 08/036,017 entitled "Method and Means for Multi-System Remote Data Duplexing and Recovery" describes the use of a store and forward message interface at the DASD storage management level between a source of update copies and a remote site in a host to host coupling in which the difference in update completeness or loss of the sequence of write updates could be completely specified in the event of interruption.

Cheffetz, et al., U.S. Pat. No. 5,133,065 entitled "Backup Computer Program for Networks" issued Jul. 21, 1992, discloses a local area network (LAN) having a file server to which each local node creates and transmits a list of local files to be backed-up. Such remote generation reduces the traffic where a network server initiates the list creation and file copying activity. Arguably, art published before this reference taught centrally administered file selection. This resulted in compromises to local node security and overuse of the server. This is presumptively avoided by Cheffetz's local node generated lists and remission of the lists to the file server.

Beal, et al., U.S. Pat. No. 5,155,845 entitled "Data Storage System for Providing Redundant Copies of Data on Different Disk Drives", dual copies variable length records (CKD) on two or more external stores by causing a write to be processed by the first storage controller and be communicated in parallel over a direct link (broad band path) to the second storage controller obviating the path length limitation between the primary and remote copy sites. Such a limitation is occasioned by the fact that CKD demand/response architecture is length limited to in the range of 150 meters.

Another example of an asynchronous system that utilizes a centralized system is disclosed in U.S. patent application Ser. No. 07/992,219, filed Dec. 17, 1992 entitled "Remote Data Duplexing Asynchronous Information Packet Message, by Micka et. al. This system discloses a system for asynchronously duplexing direct access storage device (DASD) data in a plurality of DASD subsystems that has the advantage of decoupling the data duplexing operation from the DASD write I/O operation. This ensures the write does not incur unnecessary wait states in the subsystem. By establishing a sequence checkpoint at which time a set of information packets are grouped together and processed as a single sequence unit, this decoupling and independent operation takes place. Through this independence, data copying to a secondary location can take place without affecting the performance of the subsystems and also not affecting the corresponding integrity of the data that is being updated.

There are systems in use in which there is no centralized communication service between the primary and secondary locations. Oftentimes in such system configurations each primary subsystem has a direct independent link to a selected secondary subsystem. In such a system that includes subsystems providing sequence consistent asynchronous write operations can not be addressed utilizing known asynchronous copy schemes.

What is needed is an asynchronous copy system, having independent links between primary and secondary subsystems, and no central communications system, which provides for sequence consistent remote copying from one set of multiple DASD subsystems at one location to a second set of multiple DASD subsystems at a second subsystem. The asynchronous copy system should be simple, cost effective and should not significantly impede the overall operation of the subsystems.

The present invention addresses such a need.

SUMMARY OF THE INVENTION

This invention relates to a method and means for the remote copying of data at a secondary DASD subsystems. The secondary DASD subsystems are peer coupled to counterpart ones of a primary host attached DASD subsystems. A start copy operation is initiated at the host by a message broadcast to all primary DASD subsystems. Each primary builds a configuration table using a local area network or other suitable means as a set associative device for table building. This table identifies all the primary subsystem participants. Also, each primary synchronizes its local clock or other time reference to that Of a designated primary subsystem, the designated primary being operative as a clocking and checkpoint message source. The designated primary periodically sends checkpoint messages having a sequence time value and an increasing checkpoint sequence number, to each primary subsystem. These are logically inserted into its local copy write record sequence.

At the secondary host attached DASD subsystems, one of the secondary subsystems is designated as a local synch source. Each secondary subsystem builds a configuration table of copy active subsystems, and couples to the counterpart primary subsystem. Next, each secondary subsystem asynchronously receives and locally buffers a copy sequence from its primary counterpart. Each received sequence includes checkpoint messages embedded therein at the primary after all time stamped write updated records have been sent.

Responsive to receipt of a checkpoint message, the secondary subsystem will remit it to the local synch source. A rendezvous is executed by this source over all the checkpoint messages. Thus, each secondary subsystem writes from buffer to DASD upon receipt of the rendezvous completion from the synch source.

If one or more of the primary DASD subsystems become unavailable, then their counterparts at the secondary site resign from the copygroup. Such occurs only after completion of any updates in progress.

The system of the present invention allows for distributed non-central-system operated control of a sequence-consistent real-time asynchronous data copy from a set of DASD subsystems at a primary location to a set of DASD subsystems at a secondary location, with primary subsystems separately and independently connected to secondary subsystems.

DESCRIPTION OF THE INVENTION

The present invention relates to an improvement in asynchronous remote data copying. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To perform asynchronous remote copying there are three requisites:

1. The sequence of data updates must be determinable at a local site.

2. That sequence must be communicable by the local site to a remote site.

3. The remote site must be able to use the sequence to control the updating at the remote site.

Figure 1:
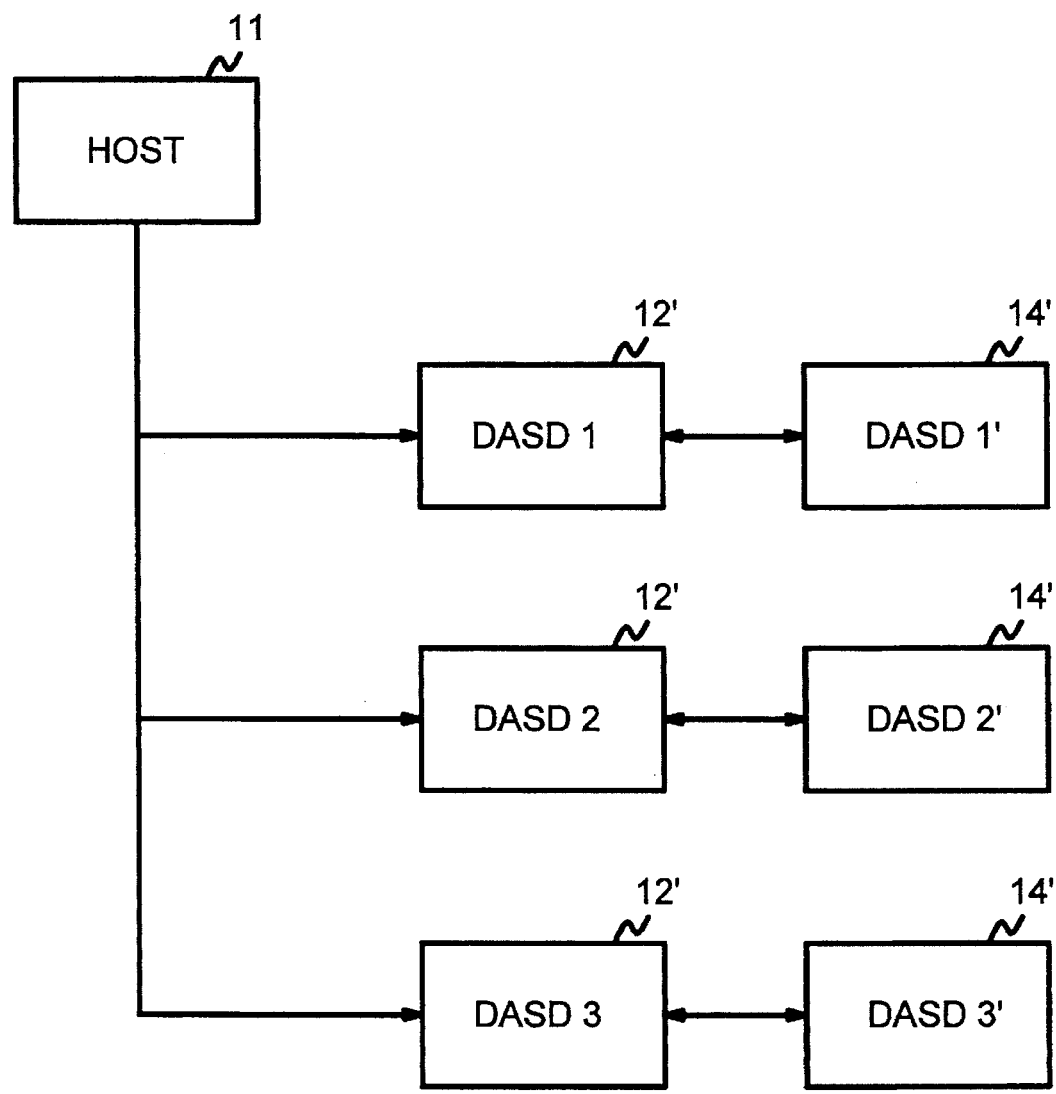
FIG. 1 is a conventional remote data copy system configuration.

As has been before mentioned, prior art asynchronous copy system which include multiple subsystems requires a central system for providing the appropriate sequences of data. However, system configurations may be found in which it is not desired to pass update data between the primary and secondary locations through a centralized communication service. Rather in those configurations it is desired to directly connect DASD subsystems at the primary and secondary via independent subsystem-to-subsystem communication links. Such a system 10 is shown in FIG. 1. The system 10 includes a host 11 which provides data to primary subsystems 12'. As is shown each of the links between a primary DASD subsystem 12' and its peer coupled secondary DASD subsystem 14' is independent. As a result, this type of system would inherently be incapable of write operations that are sequentially consistent.

To more specifically describe the problem, consider as an example a sequence of three writes from a conventional database management system (DBMS) as it is about to commit a transaction. The example is representative of an information management service (IMS) system:

1. The DBMS writes to its log data set; record written contains old data base (DB) data, new DB data (that is being changed by this transaction), and a record of its intent to commit (finalize) this transaction.

2. The DBMS waits for a DASD I/O operation to report that it has completed, then it updates its data base data sets, which are different volumes that are on a different DASD subsystems. This writing of the new DB data overwrites and thus destroys the old DB records.

3. The DBMS waits for the second DASD I/O operation to be posted complete, then it writes a commit record to its log data set on the first volume. This commit record 'guarantees' to future IMS recovery processes that the data base data set (DASD volumes) have been updated.

Now consider operation of an asynchronous remote copy system using a multiple subsystem configuration such as illustrated in FIG. 1. In this embodiment, the DBMS log data set is on a volume configured to the topmost DASD subsystem pair (DASD 1 and DASD 1') and the data base volumes are on the DASD subsystem pair shown second from the top, (DASD 2 and DASD 2'). In this example, the primary subsystem 1 is lightly loaded, thus it processes its queued work with no delay, while the primary subsystem 2 is heavily loaded and is experiencing some delay in processing its queued work. Queued work includes the forwarding of updated data to its remote copy peer subsystem.

The following sequence would describe the operation in the present example.

1. Write I/O (1) is completed from application to subsystem 1.

2. Write I/O (2) is completed from application to subsystem 2.

3. Primary Subsystem 1 sends data for I/O (1) to secondary subsystem 1, which applies it to its cache memory copy of the DASD volume.

4. Write I/O (3) is completed from application system to subsystem 1.

5. Primary Subsystem 1 sends data for I/O (3) to secondary subsystem 1, which applies it to its cache memory copy of the DASD volume.

6. Primary Subsystem 2 sends data for I/O (2) to secondary subsystem 2, which applies to its cache memory copy of the DASD volume.

If a primary site failure occurs after step 5 and before step 6 there would be corrupted data copied into the system. Since the failure rendered primary subsystems inaccessible, the data from I/O (2) will not be at the secondary site.

The essence of data sequence consistency in a remote copy service is to ensure at such a time as the remote DASD must be used for recovery, that the new data from second operation I/O above will only be seen if the data from the first I/O is also present, and that the data from the third I/O will only be present if the second I/O is also present. Consider the data integrity loss if the third I/O were present but if the second I/O was not. The DBMS log would tell recovery processes that the data base would receive valid data. This would either result in a DBMS failure or business application error.

The sequence of I/O operations at the primary subsystems is DASD 1, DASD 2, then back to DASD 1; but because of the load on DASD subsystem 2, it is delayed in sending its I/O (2) such that it has not arrived by the time I/O (3) from DASD subsystem 1 was received by secondary DASD subsystem 1'. With no control of transmission subsystem data to copy volumes, subsystem 1 would update its copy volume with both 1 and 3. If at that time a disaster befell that primary system and operations were directed to resume at the secondary site (such contingency being the reason for having a real-time remote DASD copy), the recovering DBMS would find a log record that said that data base records were written (in I/O 2) while the data for I/O 2 would not be on the DASD of secondary subsystem 2.

With such independent links, determination of sequence of writes among independent primary DASD subsystems, communication of that information to the set of subsystems at the secondary location, and control of the sequence of updates among the independent DASD subsystems at the secondary has been a problem heretofore. The present invention discloses a system and method for sequence identification, communication, and update control that will permit sequence-consistent remote DASD data copy from multiple independent DASD subsystems at one location to a set secondary DASD subsystems, each subsystem independently connected to peer subsystems at the first location.

Figure 2:
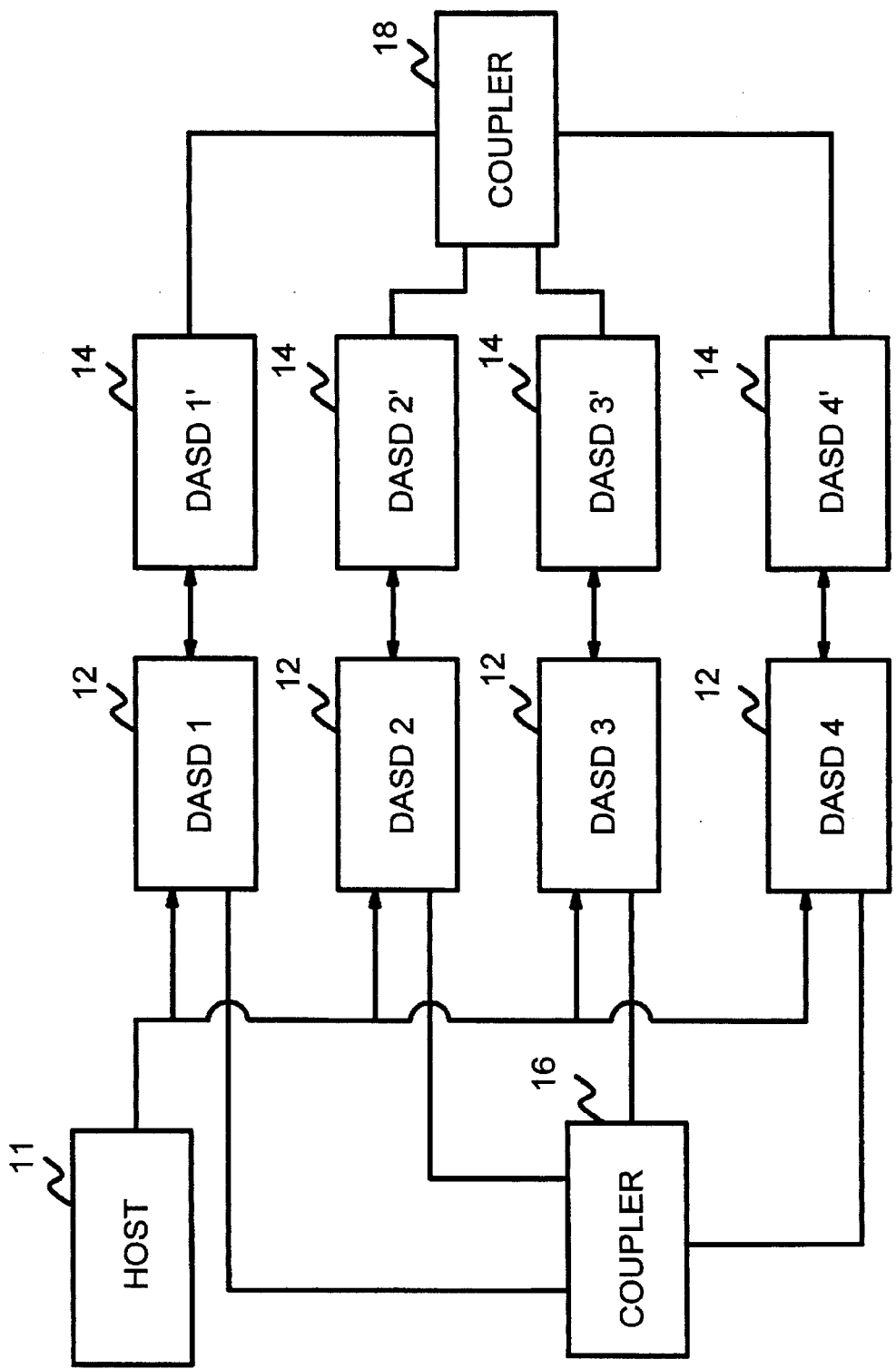
FIG. 2 is remote dual copy system configured in accordance with the present invention.

FIG. 2 is a remote dual copy system 20 configured in accordance with the present invention. The system includes the host 11 which provides data to primary subsystems 12. The system 20 includes a first group of DASD subsystems 12 which are located at a primary site and a second group of DASD subsystems 14 which are located at a site that is remote from the primary site. The system 20 includes couplers 16 and 18 which provides for interconnections of the DASD subsystems 12 and 14, respectively.

Referring now to FIG. 2, system 20 for achieving update sequence integrity without a centralized communication system is based on the presence of the following configurations.

1. Multiple primary location DASD subsystems each interconnected via one or more communication links to a peer DASD subsystem at the secondary location.

2. A coupling connection 16 of all subsystems at the primary site, and a similar coupling a connection 18 of all subsystems at the secondary site. While not shown, one of ordinary skill in the art will readily recognize multiple physical connections may be incorporated for connection redundancy. The term "coupling" is used for convenience; any suitable physical network interconnection means may be used such as a local area network or the like (LAN).

3. Each subsystem has a 'clock' or similar synchronizing signal process that can be synchronized with a value from another subsystem, communicated via the coupling 16.

Three steps are utilized to achieve copy update sequence integrity in accordance with inventive method: (1) determination of sequence of write operations among all DASD subsystems at the primary via step (2) communication of that sequence information to the secondary, and (3) use of that information by the secondary DASD subsystems to control the sequence of update writes across all secondary DASD. These three steps are described in more detail hereinbelow for a copy system used LAN interconnections at the secondary and primary subsystems.

1. Use of the LAN interconnection among the primary DASDs to distribute a sequencing signal, such as a time clock, to all subsystems is used to associate a sequence/time value with each DASD write of data to be copied to a secondary DASD subsystem (and the sending of that value along with update data to the secondary);

2. Propagation of periodic synchronizing-time-denominated checkpoint signals among the primary DASD subsystems that in turn are communicated by each primary subsystem to its peer-connected secondary subsystem(s); and 3. Use of the LAN interconnection among secondary DASD subsystems to coordinate their DASD update writing of copy data received from primary subsystems.

Figure 3:
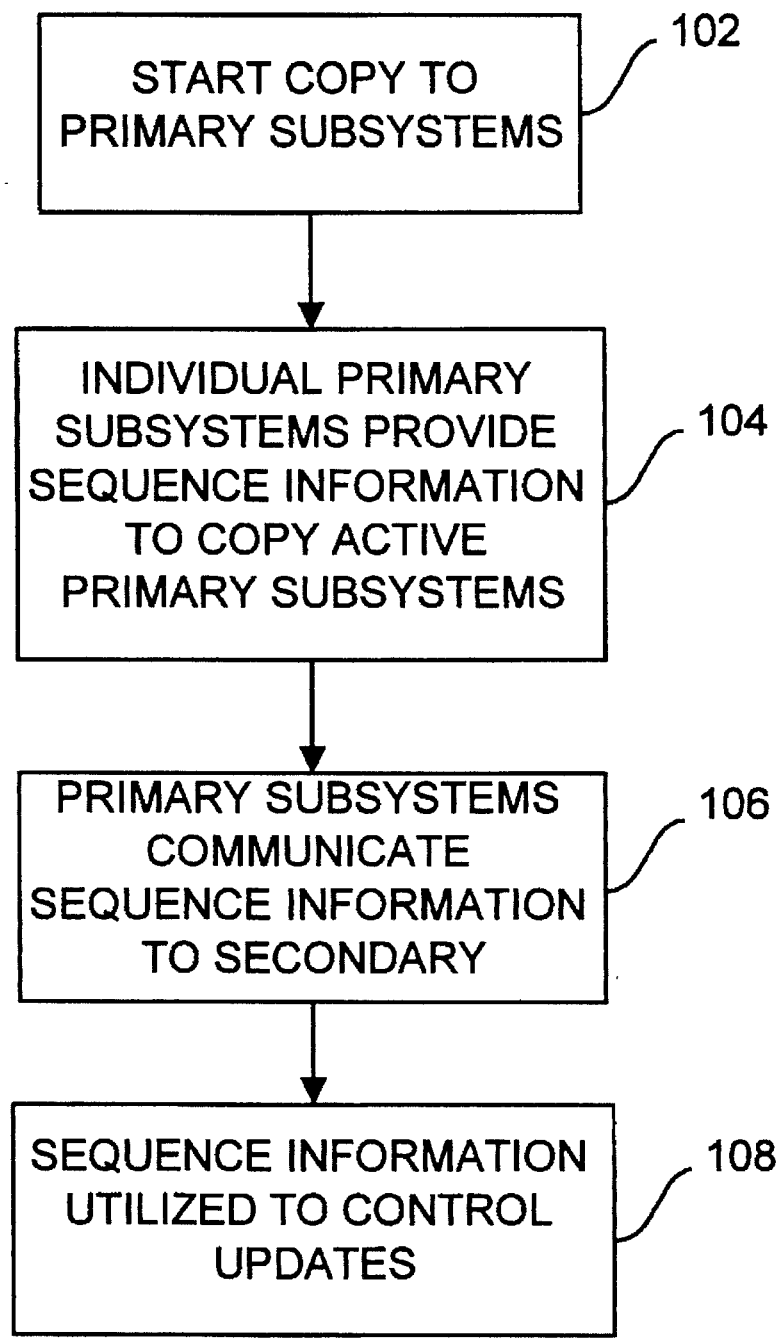
FIG. 3 is a flow chart showing the general operation of the remote dual copying in accordance with the present invention.

Referring now to FIG. 3, what is shown is a flow chart of the general operation 100 of such a system that is located within the primary subsystem. First, a start copy operation is sent to all the primary subsystems to activate communication between primary subsystems, via step 102. Then individual subsystems provide the appropriate sequence information to all the copy active primary subsystems, via step 104. Thereafter the primary subsystems communicate the sequence information to the peer coupled secondary subsystems, via step 106. Finally, that sequence information is utilized to control secondary subsystem updates via step 108.

These steps are described in detail below:

Start Copy Operation

Step 102

Remote copy operations for each DASD subsystem must be started by some instruction to that subsystem. The instruction may come via command from a host system (the same system as may be executing applications that write to DASD), or it may be provided via subsystem-local interface such as from a subsystem operator console or similar means.

Description of DASD Write Sequence at the Primary

Step 104

Figure 3A:
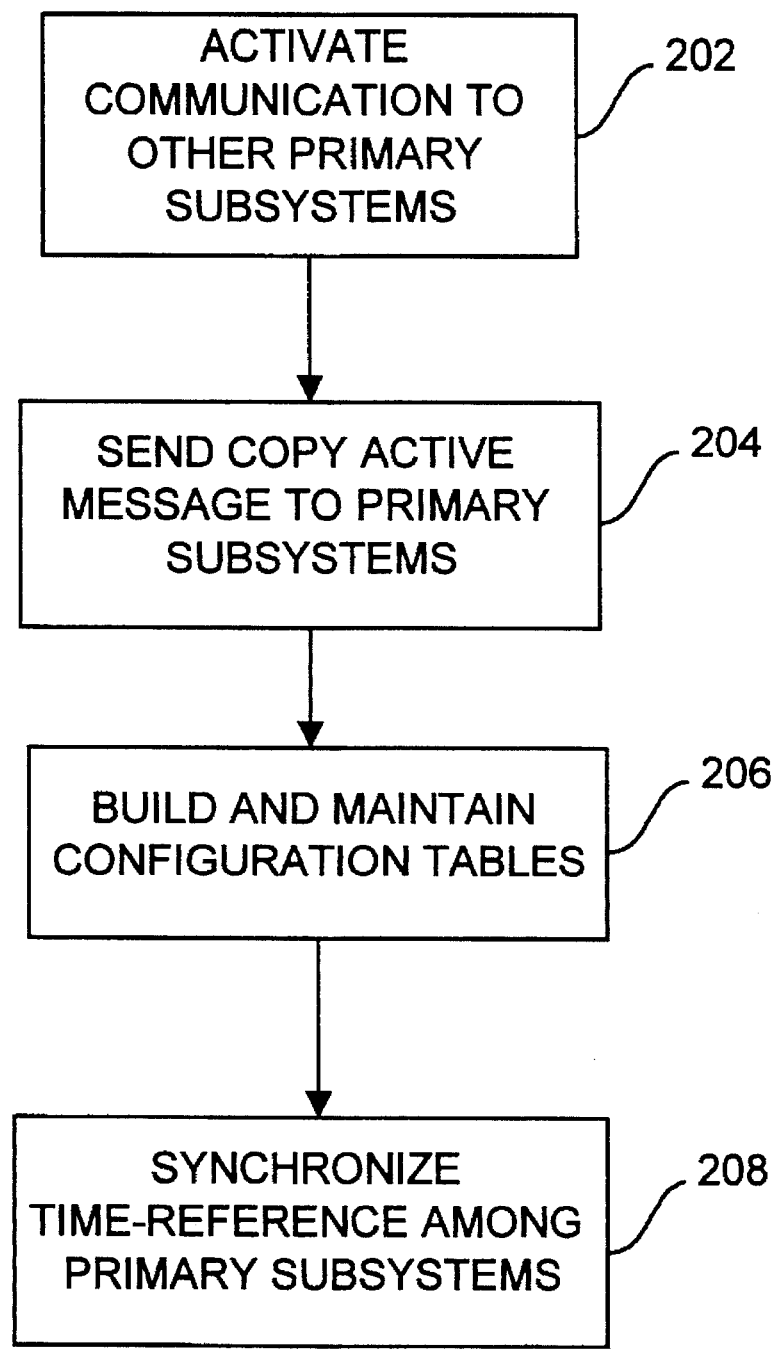
FIGS. 3A–3D are more detailed flow charts showing the operation of the remote dual copying system in accordance with the present invention.

Refer now to FIG. 3A and the following discussion.

Irrespective of whether the command comes from the host system or from subsystem local interface, the start copy instruction identifies the DASD to be copied and causes the subsystem to activate communications with secondary subsystem(s) to which it is connected via step 202.

The start copy operation also activates communication from that DASD subsystem to other primary DASD subsystems. The LAN connection addresses of other primary DASD subsystems may be configured to each subsystem or it may be incorporated in information contained in the start copy instruction to the subsystem. When copy is started at a subsystem, each subsystem sends a subsystem copy active message to all other primary subsystems it has addresses for via step 204. All primary subsystems build and maintain configuration tables such that each subsystem knows the identity of all primary subsystems participating in the copy process via step 206. Each subsystem receiving a copy active message from another subsystem marks that subsystem as a copy active in its configuration tables.

As a part of exchanging copy active messages with the other primary systems, the subsystems synchronize their sequence clock processes and select one subsystem to be a master source for a timing value synchronization signal via step 208. This is a clock synchronization process, not described here since such processes are well known in the art.

Note: Clock synchronization must be able to maintain clock drift such that maximum drift is substantially less than the time for a subsystem to receive a write command from a system, perform a write to cache, signal end of I/O operation, and for the host to process the I/O completion status and start a new DASD I/O write operation.

As write operations are performed by each subsystem, in a preferred embodiment, the subsystem includes the then current time sequence signal value with other control information that is sent with the DASD data to its connected secondary subsystem. The primary system DASD write I/O operation continues without delay, extended only by the time necessary to construct control information for the data to be sent to the secondary. DASD and control data are buffered in the secondary subsystem on receipt. Update of secondary DASD copy is deferred until released by secondary sequence control (described below).

Communication of Sequence Information to Secondary DASD Subsystems

Step 106

Figure 3B:
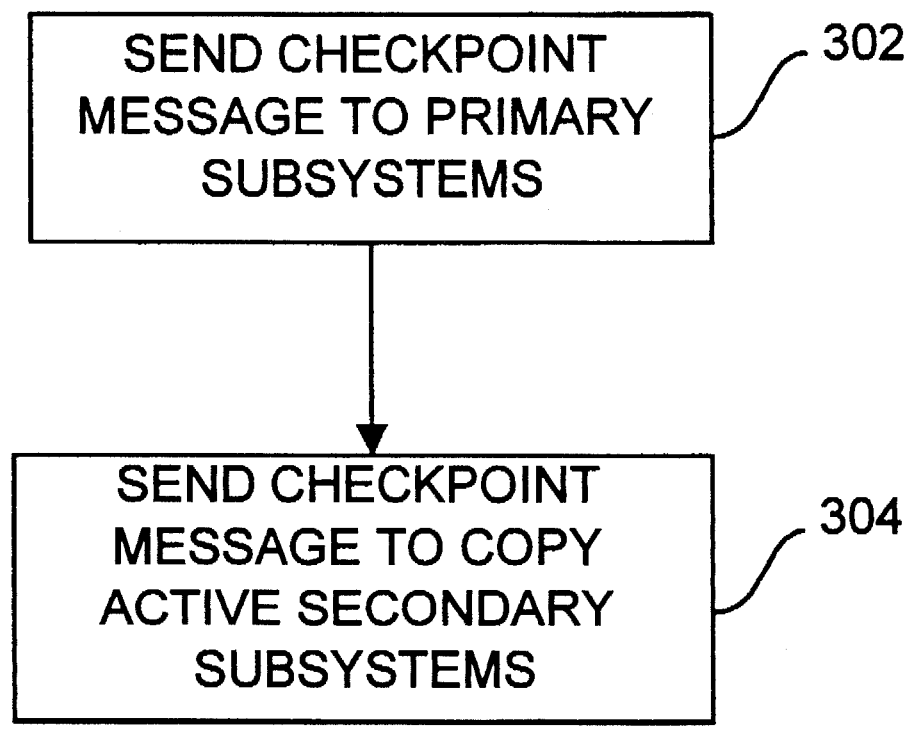

Refer now to FIG. 3B and the following discussion. The subsystem that is providing the time synchronizing signal source will periodically send a checkpoint message to all primary copy-active subsystems via step 302. This may be included with the time sync signal or sent separately as appropriate for the local interconnection protocol used. The checkpoint message includes a sequence time value and a checkpoint sequence number that is incremented by one for each checkpoint message. Each subsystem on receiving the checkpoint communication will logically insert it in its transmission stream to the secondary subsystem(s) to which it is connected, sending it to secondary subsystem(s) only after all DASD and control information with an earlier sequence time signal value have been sent via step 304.

Use of Sequence Information by Secondary DASD Subsystems to Control Secondary DASD Updates Step 108

Figure 3C:
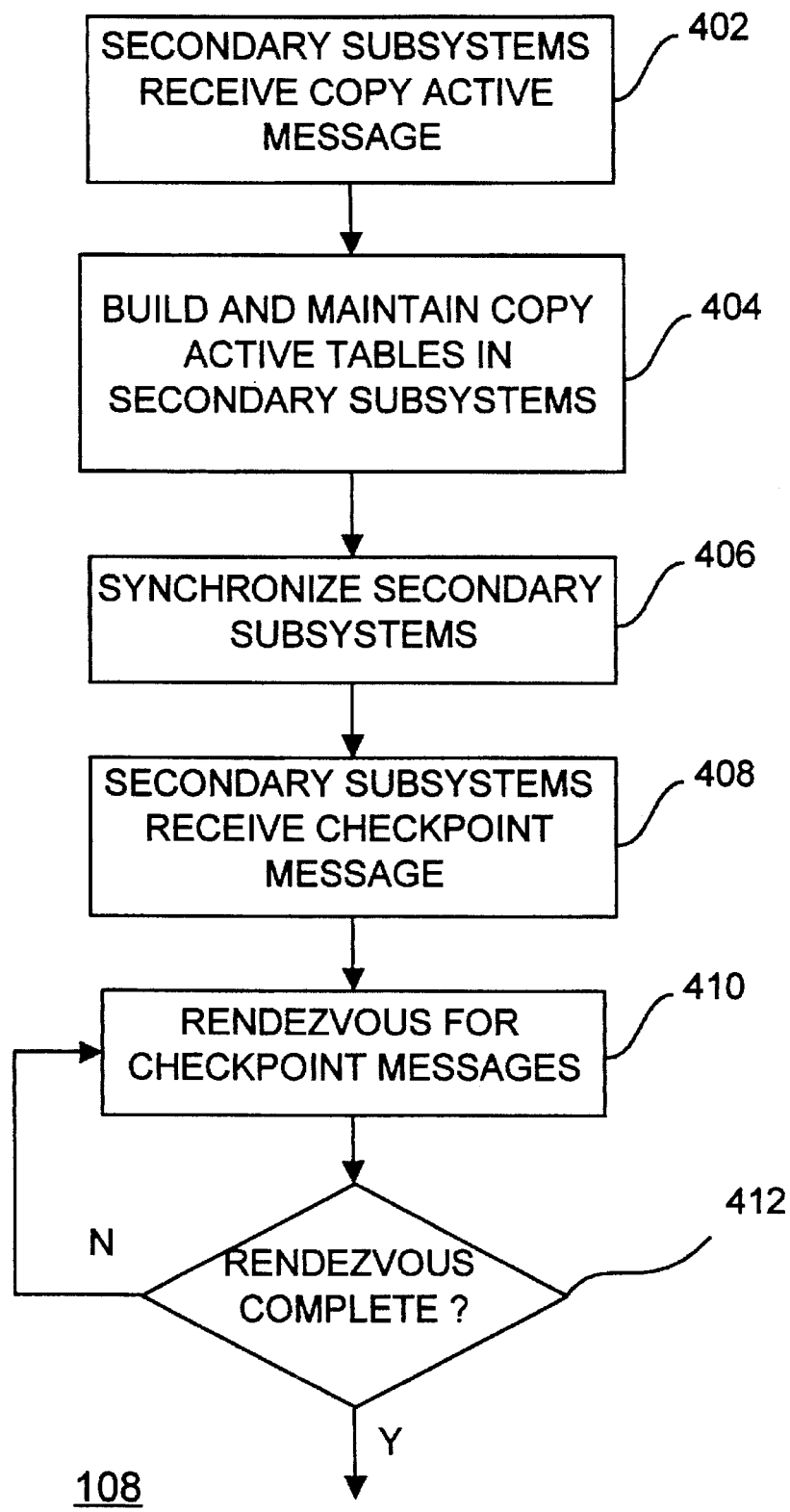
Figure 3D:
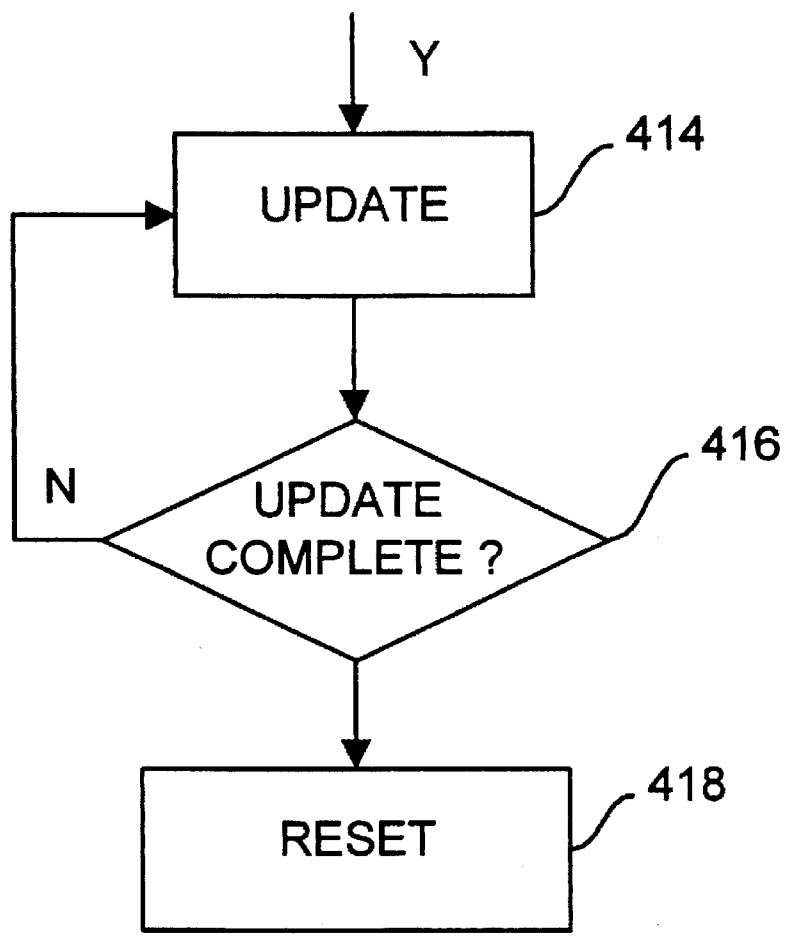

Refer now to FIGS. 3C and 3D and the following discussion. Copy operations in secondary systems are activated by copy active messages from their connected primary subsystems via step 402. (An enabling startup instruction from a system or local console at the secondary may also be required. That aspect of copy operation and control is performed in a conventional manner.) Secondary subsystems build and maintain copy active tables such that each subsystem has data relating to the identity of all secondary subsystems participating in the copy process, via step 404. A synchronizing control master is selected from among the secondary subsystems, using the local interconnect (LAN) similar to the manner in which a primary synchronizing signal source was selected, via step 406. Such distributed control schemes are well known and need not be described here.

Secondary subsystems receive and buffer DASD data and associated control information from their connected primary subsystems. This received data and control information is logically grouped and sequenced by the primary synchronizing signal value. For maximum protection, received data and control information buffering should be in a non-volatile storage medium.

At some point, each subsystem will receive a checkpoint control message via step 408 that signifies that all DASD update data and control with a primary synchronizing signal value equal to or less than the checkpoint time sync value has been sent to that secondary subsystem. A checkpoint message, when received, is sent by the receiving subsystem to the secondary master subsystem, which performs a rendezvous for that checkpoint message from all copy-active secondary subsystems, including itself, via step 410.

When the rendezvous is complete via step 412 for a given checkpoint value, the secondary master subsystem sends a message to all secondary copy-active subsystems to release update data up to the primary sequence time value of the checkpoint. Each subsystem then marks itself in an internal update in progress state and applies the updates to its secondary DASD copy via step 414. (Note: The actual process of applying the buffered DASD copy data may require only adjusting cache directory entries.)

The update in progress state must be maintained through subsystem resets and power off along with buffered data and control info from the primary (and other copy service state information). It is used as a must-complete type operation control that precludes any host system access to secondary DASD when that state is active. This ensures that an application takeover at the secondary cannot see partial updated DASD data. That is, it can not access a sequence-inconsistent DASD copy. Update for the checkpoint interval must be complete before a user can access the copy DASD subsystems records.

When the updating of DASD copy data has completed, the subsystem sends an update complete for checkpoint message (identifying the specific checkpoint) for that checkpoint to the secondary master, via step 416. When update complete signal for checkpoint messages have been received at the master from all subsystems including the master, the master then sends a reset update in progress state message to all secondary subsystems to allow secondary copy data to again be accessible to attached systems, via step 418.

In a variation to the preferred embodiment, if the coupling means among all primary subsystems can reliably propagate every checkpoint message to all subsystems in substantially less time than the time for an I/O operation cycle then the preceding processes could function without a clock and clock sync. The arrival time of a checkpoint message at each primary subsystem would be precise enough to define update sequence. All updates within a checkpoint would be considered to have occurred at the same time.

The steps of subsystem operation for the three I/Os described previously, using the system in accordance with present invention is discussed herein below.

1. DASD 1, 2 and 3, and 4 exchange 'copy active' messages. Primary subsystem 3 has become the master source for timing value sync signal. Secondary system 4 has become the secondary master for rendezvous of checkpoint messages.

2. Write I/O (1) is completed from application to subsystem 1 at time 'a'.

3. Write I/O (2) is completed from application to subsystem 2 at time 'b'.

4. Primary Subsystem 1 sends data for I/O (1) to secondary subsystem 1 along with its associated time value 'a'. Secondary subsystem 1 buffers the data but does not apply it to its cache copy for the DASD volume.

5. Subsystem 3 sends a checkpoint message containing checkpoint sequence number 'n' and time value 'b'.

6. Write I/O (3) is completed from application system to subsystem 1 at time 'c'.

7. Primary Subsystem 1 sends data for I/O (3) to secondary subsystem 1 along with its associated time value 'c'. Secondary subsystem 1 buffers the data but does not apply it to its cache copy for the DASD volume.

8. Primary subsystem 1 receives and processes the checkpoint message sent by subsystem 3 in step 5.

9. Primary subsystem 1 sends checkpoint message to secondary subsystem 1, which forwards it to secondary subsystem 4.

10. Primary Subsystem 2 sends data for I/O (2) to secondary subsystem 2 along with its associated time value 'b'. Secondary subsystem 2 buffers the data but does not apply it to its cache copy for the DASD volume.

11. Primary subsystem 2 receives and processes the checkpoint message sent by subsystem 3 in step 5.

12. Primary subsystem 2 sends checkpoint message to secondary subsystem 2, which forwards it on to secondary subsystem 4.

13. At some point between steps 5 and 13, subsystems 3 and 4 have sent the checkpoint message 'n' to their secondary subsystems. Secondary subsystem 3 has forwarded it to secondary subsystem 4.

14. Secondary subsystem 4 sends a 'release' message to secondary subsystems 1, 2 and 3.

15. Secondary subsystem 3 having no update immediately returns an "update complete" message to secondary subsystem 4.

16. Secondary subsystem 1 enters 'update in progress' state, then applies update (1). It does not apply update (3) since its sync time value 'c' is greater than checkpoint time value 'b'. It then sends an update complete message to secondary subsystem 4.

17. Secondary subsystem 2 enters update state and applies update (2), and sends an update complete message to secondary subsystem 4.

18. Secondary subsystem 4 having received update complete messages from all secondary subsystems, sends a 'reset update in progress state' message to secondary subsystems 1, 2 and 3.

Now if a primary site failure happens at any point in the above sequence the secondary DASD will either show none of the updates, or will show updates (1) and (2). Update (3) will not be 'applied' to secondary subsystem 1's DASD and cache until the next checkpoint sequence.

Accordingly, through the present system a sequence consistent real-time asynchronous copy system is provided that does not require the use of central communications service. In so doing, a system is provided that requires minimal modification, while utilizing existing capabilities within the DASD subsystems to provide for sequence modifications.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. In a data copy asynchronous system, the data copy system including a first plurality of subsystems at a primary site, the first plurality of subsystems being interconnected by a first coupling means; a second plurality of subsystems at a site remote from the primary site, the second plurality of subsystems being interconnected by a second coupling means, each of the second plurality of subsystems being independently coupled to one of the first plurality of subsystems, an updating system for providing sequence consistent write operations comprising:

in the first plurality of subsystems;
means for distributing a sequence signal to the first plurality of subsystems;
means responsive to the distributing means for sending a periodic synchronizing time-denominated checkpoint signal to the first plurality of subsystems, the checkpoint signal having a predetermined relationship with the sequence signal;
means responsive to the checkpoint sending means for sending updated data and the checkpoint signal to each of the peer coupled second plurality of subsystems; and in the second plurality of subsystems;
means for receiving the updated data and checkpoint signals; and
means for coordinating a writing of the updated data;

wherein the first and second plurality of subsystems form a database management system.

2. The updating system of claim 1 in which the distributing means further comprises:

first means for activating each of the first plurality of subsystems to communicate with the other of the first plurality of subsystems;
second means responsive to the first activating means for activating the first plurality of subsystems to communicate with its peer coupled subsystem of the second plurality of subsystems;
means responsive to the second activating means for building configuration tables in each of the first plurality of subsystems such that each of the first plurality of subsystems can identify all of the other first plurality of subsystems; and
means responsive to the building means for synchronizing the first plurality of subsystems.

3. The updating system of claim 1 in which the checkpoint signal sending means comprises:

means for sending a checkpoint message to the first plurality of subsystems; and
means responsive to the checkpoint message sending means for inserting the checkpoint message into an update data sequence of the first plurality of subsystems.

4. The updating system of claim 1 in which the coordinating means comprises:

means for receiving copy active messages in the second plurality of subsystems;
means responsive to the copy active sending means for building copy active tables in the second plurality of subsystems;
means responsive to the building means for synchronizing copy operations of second plurality of subsystems;
means responsive to the synchronizing means for receiving the checkpoint messages in the second plurality of subsystems;
means responsive to the checkpoint messages receiving means for performing a rendezvous for all checkpoint messages in the second plurality of subsystems; and
means responsive to the performing means for providing the updated data to second plurality of subsystems.

5. A method for achieving update sequence integrity of a data copy at a plurality of subsystems remote from a source of asynchronous independently generated sequence of write operations, the system including a first plurality of subsystems at a primary site, the first plurality of subsystems being interconnected by a first coupling means; a second plurality of subsystems at a site remote from the primary site, the second plurality of subsystems being interconnected by a second coupling means, each of the second plurality of subsystems being independently coupled to one of the first plurality of subsystems, the method comprising the steps of:

(a) distributing a sequence signal to the first plurality of subsystems;

(b) sending a periodic synchronizing time-denominated checkpoint signal to the first plurality of subsystems, the check point signal having a predetermined relationship with the sequence signal;

(c) sending updated data and the checkpoint signal to each of the peer coupled second plurality of subsystems; and (d) coordinating a writing of the updated data from each of the plurality of first subsystems to each of the independently coupled second plurality of subsystems based upon the checkpoint signal, wherein data integrity is maintained in a database management system formed by the first and second plurality of subsystems.

6. The method of claim 5 in which the distributing step (a) further comprises the steps of:

activating each of the first plurality of subsystems to communicate with the second plurality of subsystems;

activating the second plurality of subsystems to communicate with its peer coupled subsystem at the remote site;

building configuration tables in each of the first plurality of subsystems such that each of the first plurality of subsystems can identify all of the other first plurality of subsystems at the primary site; and synchronizing the subsystems at the primary site.

7. The method of claim 5 in which the checkpoint signal sending step (b) further comprises the steps of:

sending a checkpoint message to the first plurality of subsystems; and inserting the checkpoint message into an update data sequence of first plurality of subsystems.

8. The method of claim 5 in which the coordinating step (d) comprises the steps of:

receiving copy active messages in the second plurality of subsystems;

building copy active tables in the second plurality of subsystems;

synchronizing copy operations of second plurality of subsystems;

receiving the checkpoint messages in the second plurality of subsystems;

performing a rendezvous for all checkpoint messages in the second plurality of subsystems; and providing the updated data to the second plurality of subsystems.

9. In a system for remote copying of data at a secondary site having a coupling plurality of storage device (DASD) subsystems that are interconnected by a first coupling means, said secondary DASD subsystems being coupled to counterpart ones of a plurality of DASD subsystems at a remote primary site, said secondary DASD subsystem being interconnected by a second coupling means said system including means at the primary site for initiating a start copy operation, a method comprising the steps of:

(a) at the primary and secondary sites, forming an copyset groups of DASD subsystems respectively;

(b) at the primary site,
 (1) causing each of the m subsystems to asynchronously generate a sequence of updated write records,
 (2) ordering each of said sequences by embedding common clock values and a periodic checkpoint message with a common clock value and increasing a sequence number in each of said sequences,
 (3) coupling counterpart DASD subsystems between the sites and asynchronously communicating sequences from each of the primary site subsystems into a buffered portion of a counterpart secondary site subsystem; and (c) at the secondary site, writing the buffered sequences to DASD in the counterpart subsystems as a function of each checkpoint message wherein data integrity is maintained in a database management system formed by the remote primary and secondary sites of DASD sub-systems.

10. In a system for remote copying of data at a secondary site, a CPU attached plurality of direct access storage device (DASD) subsystems, said secondary DASD subsystems being coupled to counterpart ones of a plurality of DASD subsystems CPU attached at a remote primary site, said system including means at the primary site for initiating a start copy operation, a method comprising the steps of:

(a) at the primary site responsive to initiation of the start copy operation, ascertaining at each subsystem the subset of the plurality of DASD subsystems forming the copyset group, designating one of the plurality of subsystems as a clocking and checkpoint message source, each checkpoint message including a sequence clock value and an increased sequence number;

(b) at the secondary site, repeating step (a) for counterpart ones of the DASD subsystems;

(c) at the primary site, periodically generating clocking signals and checkpoint messages by said designated subsystem and broadcasting said signals and messages as they occur to other subsystems forming the copyset group including itself, at each subsystem in the copyset group:
 (1) asynchronously forming a local sequence of updated records,
 (2) embedding slid signals and messages into the sequence to form a time discriminated total ordering of updated records, and
 (3) remitting at least a portion of the sequence to a buffer portion of the counterpart DASD subsystem at the secondary site; and (d) at the secondary site, applying a checkpoint message to the designated subsystem operative as a synchronizing source by each subsystem in the copyset group and writing the sequences or portions thereof stored in the buffered portions of said subsystems to DASD only a signal from said designated subsystem indicative of its receipt of all send messages wherein data integrity is maintained in a database management system formed by the remote primary and secondary sites of DASD sub-systems.

11. The method according to claim 10, wherein each message signifies that all DASD records with a clock signal that have a sequence number that is less than the checkpoint message sequence clock value have been transmitted to the counterpart secondary subsystem.

12. In a data copy asynchronous system, the data copy system including a first plurality of subsystems at a primary site, the first plurality of subsystems being interconnected by a first coupling means; a second plurality of subsystems at a site remote from the primary site, the second plurality of subsystems being interconnected by a second coupling means, each of the second plurality of subsystems being independently coupled to one of the first plurality of subsystems, a method for providing sequence consistent write operations comprising the steps of:

in the first plurality of subsystems;
- (a) distributions a checkpoint signal to the first plurality of subsystems;
- (b) sending a checkpoint signal to the first plurality of subsystems, the checkpoint signal having a predetermined relationship with the sequence signal;
- (c) sending updated data and the checkpoint signal to each of the peer coupled second plurality of subsystems; and in the second plurality of subsystems;
- (d) receiving the updated data and checkpoint signals; and
- (e) coordinating a writing of the updated data wherein data integrity is maintained in a database management system formed by the first and second plurality of subsystems.

13. The method of claim 12 in which the distributing step further comprises the steps of:

activating each of the first plurality of subsystems to communicate with the other of the first plurality of subsystems;

activating the first plurality of subsystems to communicate with its peer coupled subsystem of the second plurality of subsystems;

building configuration tables in each of the first plurality of subsystems such that each of the first plurality of subsystems can identify all of the other first plurality of subsystems; and synchronizing the first plurality subsystems.

14. The method of claim 12 in which the checkpoint signal sending step (c) further comprises the steps of:

sending a checkpoint message to the first plurality of subsystems; and inserting the checkpoint message into an update data sequence of first plurality of subsystems.

15. The method of claim 12 in which the coordinating step (e) further comprises the steps of:

receiving copy active messages in the second plurality of subsystems;

building copy active tables in the second plurality of subsystems;

synchronizing copy operations of second plurality of subsystems;

receiving the checkpoint messages in the second plurality of subsystems;

performing a rendezvous for all checkpoint messages in the second plurality of subsystems; and providing the updated data to second plurality of subsystems.

16. A computer readable medium containing program instructions for providing sequence consistent write operations in an updating system of a data copy asynchronous system having a first plurality of interconnected primary subsystems and a second plurality of interconnected remote subsystems, each of the second plurality of subsystems coupled to one of the first plurality of subsystems, the program instructions comprising:

distributing a sequence signal to the first plurality of subsystems;

sending a checkpoint signal to the first plurality of subsystems in response to the sequence signal, the checkpoint signal and the sequence signal having a predetermined relationship;

sending updated data and the checkpoint signal to each corresponding second plurality of subsystems;

receiving the updated data and checkpoint signals; and coordinating a writing of the updated data wherein integrity is maintained in a database management system formed by the first and second plurality of sub-systems.

* * * * *